United States Patent
Morrison

(10) Patent No.: US 11,631,963 B2
(45) Date of Patent: Apr. 18, 2023

(54) OPTICAL DEVICE WITH COATING FOR OPERATION IN MULTIPLE ENVIRONMENTS

(71) Applicant: Freedom Photonics LLC, Goleta, CA (US)

(72) Inventor: Gordon Barbour Morrison, Summerland, CA (US)

(73) Assignee: Freedom Photonics LLC, Goleta, CA (US)

( * ) Notice: Subject to any disclaimer, the term of this patent is extended or adjusted under 35 U.S.C. 154(b) by 142 days.

(21) Appl. No.: 17/025,962

(22) Filed: Sep. 18, 2020

(65) Prior Publication Data

US 2023/0026282 A1    Jan. 26, 2023

Related U.S. Application Data

(60) Provisional application No. 62/902,240, filed on Sep. 18, 2019.

(51) Int. Cl.
*H01S 5/00* (2006.01)
*H01S 5/028* (2006.01)
*H01S 5/026* (2006.01)

(52) U.S. Cl.
CPC ............ *H01S 5/0287* (2013.01); *H01S 5/026* (2013.01); *H01S 5/0282* (2013.01)

(58) Field of Classification Search
CPC ......... H01S 5/0287; H01S 5/026; H01S 5/028
See application file for complete search history.

(56) References Cited

U.S. PATENT DOCUMENTS

| | | | | |
|---|---|---|---|---|
| 5,771,254 A * | 6/1998 | Baldwin | ............ | H01S 5/02253 372/31 |
| 5,809,050 A * | 9/1998 | Baldwin | ............ | H01S 5/02257 372/50.1 |
| 2009/0028492 A1 * | 1/2009 | Wu | ........................ | G02B 6/125 385/32 |
| 2013/0322480 A1 * | 12/2013 | Edam | .................... | H01S 5/3402 372/45.01 |
| 2015/0117484 A1 * | 4/2015 | Sugiyama | ............. | H01S 5/0281 372/45.01 |
| 2016/0164254 A1 * | 6/2016 | Inao | .................... | H01S 5/18366 372/44.01 |

* cited by examiner

*Primary Examiner* — Kinam Park
(74) *Attorney, Agent, or Firm* — Knobbe, Martens, Olson & Bear, LLP

(57) ABSTRACT

An optical system comprising an optoelectronic device having a facet and a coating on the facet. The facet is configured to be in optical communication with at least a first optical medium during a first time period and a second optical medium during a second time period. The first optical medium has a first refractive index and the second optical medium has a second refractive index different from the first refractive index. The coating is configured to provide a first reflectance during the first time period for optical signals in a predetermined wavelength range and to provide a second reflectance during the second time period for optical signals in the predetermined wavelength range wherein the second reflectance is equal to the first reflectance within a negligible margin for optical signals having at least one wavelength in the predetermined wavelength range.

20 Claims, 8 Drawing Sheets

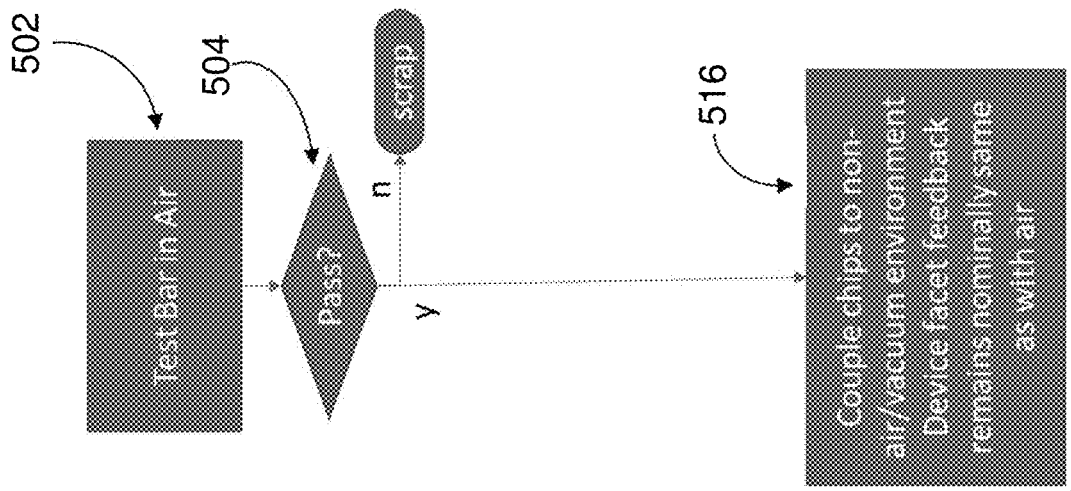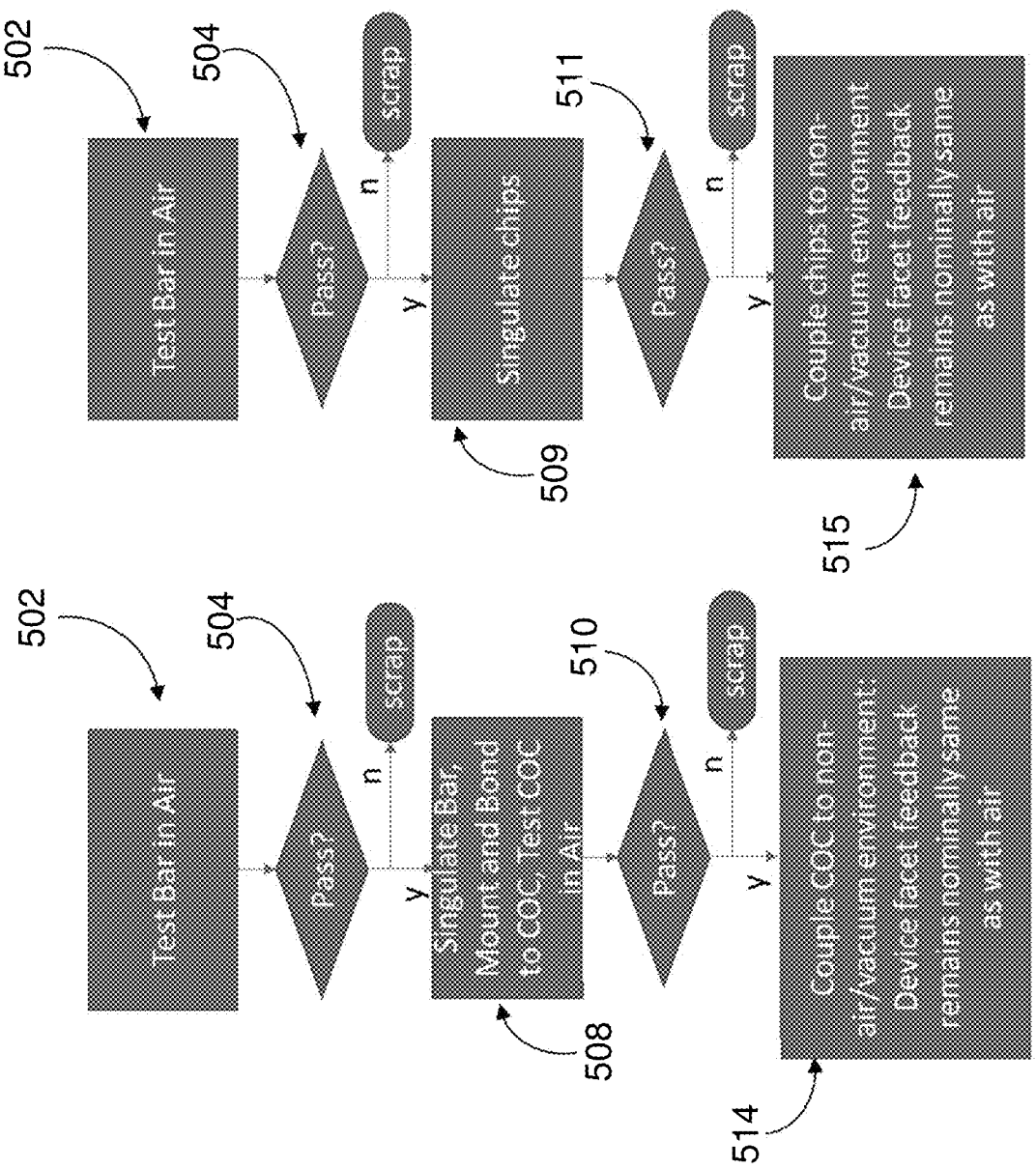

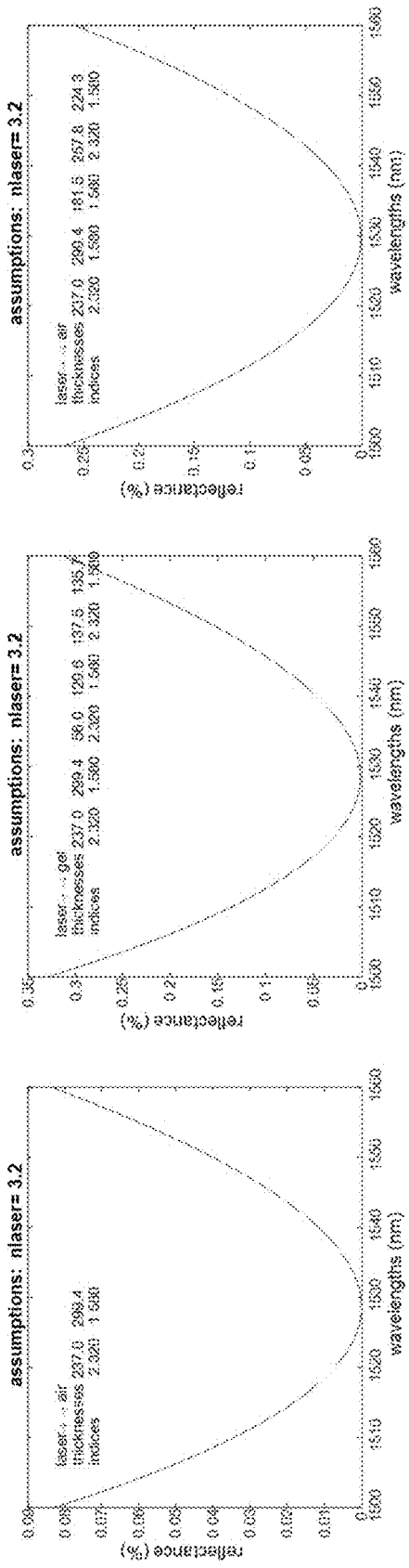
FIG. 6A — Prior to additional layers, air index — Coating 400a
FIG. 6B — 4 additional layers, in index 1.5 — Coating 400b
FIG. 6C — 3 additional layers, in index 1.5 — Coating 400c

OPTICAL DEVICE WITH COATING FOR OPERATION IN MULTIPLE ENVIRONMENTS

INCORPORATION BY REFERENCE TO ANY PRIORITY APPLICATIONS

This application claims the benefit under 35 U.S.C. § 119(e) of U.S. Provisional Application No. 62/902,240 filed on Sep. 18, 2019 titled "OPTICAL DEVICE WITH COATING FOR OPERATION IN MULTIPLE ENVIRONMENTS", which is incorporated herein by reference in its entirety.

BACKGROUND

In many optoelectronic applications, light generated by or transmitted through semiconductor lasers or other optoelectronic devices and components may be transmitted or coupled to more than one medium, either during the procedure of test, fabrication and assembly or during field use. Optical systems and devices (e.g., lasers and other optoelectronic components) comprising at least one first optical medium (e.g., doped glass, SiNx, Si, polymer, IIIV semiconductor and the like) will have an interface between the optical device and a second optical medium (e.g., air; water; solid optical medium) to which the first optical medium is coupled, and at least portions of optical signals transmitted from/to the first optical medium to/from the second optical medium will be reflected from the interface. For many applications, multilayer coatings (e.g., anti-reflection coatings; partially reflective coatings; high reflection coatings) are designed to tailor these reflections at the interface between the device end (e.g., a facet) and the second optical medium (e.g., an environment surrounding the device).

SUMMARY

In an aspect described herein, an optical system comprises an optoelectronic device having a facet and a coating on the facet. The facet is configured to be in optical communication with at least a first optical medium during a first time period and a second optical medium during a second time period. The first optical medium has a first refractive index and the second optical medium has a second refractive index different from the first refractive index. The coating is configured to provide a first reflectance during the first time period for light or optical signals in a predetermined wavelength range and to provide a second reflectance during the second time period for optical signals in the predetermined wavelength range. The second reflectance is within ±20% (e.g., within ±10%; within ±5%) of the first reflectance for optical signals having at least one wavelength in the predetermined wavelength range. (The term refractive index or index of refraction is used herein to include both the refractive index of a material such as a bulk material or medium like air, water, gel or glass as well as the effective refractive index of a waveguide or waveguide structure. Likewise, the terms refractive index, index of refraction, and effective refractive index are used interchangeably herein.)

In certain such aspects, the first reflectance as a function of wavelength and the second reflectance as a function of wavelength intersect one another at least once in the predetermined wavelength range. For example, the first reflectance as a function of wavelength can increase monotonically with wavelength in the predetermined wavelength range and the second reflectance as a function of wavelength can decrease monotonically with wavelength in the predetermined wavelength range, both the first reflectance as a function of wavelength and the second reflectance as a function of wavelength can decrease monotonically with wavelength in the predetermined wavelength range, or both the first reflectance as a function of wavelength and the second reflectance as a function of wavelength can increase monotonically with wavelength in the predetermined wavelength range. For another example, the first reflectance as a function of wavelength can be equal to the second reflectance as a function of wavelength within ±20% (e.g., within ±10%; within ±5%) across the predetermined wavelength range. In certain aspects, the second optical medium has a refractive index in a range of 1.4 to 1.9 and the first reflectance as a function of wavelength and the second reflectance as a function of wavelength are both less than 3% across the predetermined wavelength range. In certain aspects, the predetermined wavelength range has a width of at least 60 nanometers, the predetermined wavelength range is from 1500 nanometers to 1560 nanometers, and/or the first optical medium comprises air and the second optical medium is selected from the group consisting of: water, a passive waveguide structure, an index matching gel or epoxy.

In certain aspects, the facet is configured to be in optical communication with a third optical medium during a third time period, the third optical medium having a third refractive index different from the first refractive index and the second refractive index. The coating can be configured to provide a third reflectance during the third time period for optical signals with the predetermined wavelength range. The third reflectance can be within ±20% (e.g., within ±10%; within ±5%) of the first reflectance for optical signals having the at least one wavelength and within ±20% (e.g., within ±10%; within ±5%) of the second reflectance for optical signals having the at least one wavelength.

In certain aspects, the optoelectronic device is configured to be switched back and forth between being operated in a first environment in which the facet is in optical communication with the first optical medium (e.g., air) and being operated in a second environment in which the facet is in optical communication with the second optical medium (e.g., water).

In another aspect described herein, a method of fabricating an optical system comprises applying at least one first layer to a facet of an optoelectronic device. The facet is configured to be in optical communication with a first optical medium, having a first refractive index, during a first time period and with a second optical medium, having a second refractive index, during a second time period after the first time period, wherein the first refractive index and the second refractive index are different. The at least one first layer forms a first coating configured to provide a first reflectance during the first time period for optical signals having at least one wavelength in a predetermined wavelength range. The method further comprises, after the first time period and before the second time period, applying at least one second layer to the at least one first layer. The at least one first layer and the at least one second layer form a second coating configured to provide a second reflectance during the second time period for optical signals having the at least one wavelength in the predetermined wavelength range. In some examples, the refractive index of the optoelectronic device can be from 2.5 to 4, the first optical medium is that of air or vacuum, and the refractive index of the second optical medium is from 1.3 to 2.2.

In certain such aspects, the method further comprises placing the optoelectronic device in optical communication with the first optical medium and testing the operation or the performance of the optoelectronic device during the first time period, and said applying the at least one second layer is performed only in response to the optoelectronic device successfully passing said testing. In certain aspects, the method further comprises, after applying the at least one second layer, placing the optoelectronic device in optical communication with the second optical medium.

In another aspect described herein, a method is provided for coating lasers to allow prescreening of lasers prior to assembly into a system in which the facet interfaces with another medium, such as water, index matching gel or epoxy, glass, or other waveguide.

In another aspect described herein, a method is provided for reducing reflections from a facet of a laser bar, an optical waveguide, or other optoelectronic devices that are in optical communication with more than one optical medium or environment (e.g., air, optical gel, index matching gel, or water) during different time periods.

In another aspect described herein, a method is provided for keeping optical reflections from a surface or facet similar or equal within certain margin regardless of whether the surface is in optical communication with a first optical medium or environment (e.g., air) or a second optical medium or environment (e.g., index matching gel, air or some other optical media).

In another aspect described herein, a method is provided by which a layer or coating is deposited to tailor reflections to a desired result (e.g., a desired reflection) in a first medium having a first refractive index and then later additional layers or coatings are added to attain a similar result or a reflection equal to the desired reflection within certain margin in a second medium having a second refractive index. (As discussed above, the term refractive index or index of refraction is used herein to include both the refractive index of a material such as a bulk material or medium like air, water, gel or glass as well as the effective refractive index of a waveguide or waveguide structure. Likewise, the terms refractive index, index of refraction, and effective refractive index are used interchangeably herein.)

BRIEF DESCRIPTION OF THE DRAWINGS

FIG. 5A is a flow diagram for an example method of testing, mounting and coupling a plurality of optoelectronic devices having a coating on their output facets designed to reduce reflectance when the optoelectronic devices are in optical communication with a first medium (e.g., air) at a first time and with a second medium (e.g., optical gel) at a second time, wherein the plurality of the optical devices are tested before and after being mounted on a chip-on-chip (COC).

FIG. 5B is a flow diagram for an example method of testing and coupling an optoelectronic device having a coating on its output facet designed to reduce reflectance when the optoelectronic device is in optical communication with a first medium (e.g., air) at a first time and with a second medium (e.g., optical gel) at a second time, wherein the optoelectronic device is tested before and after being singulated from a bar.

FIG. 5C is a flow diagram for an example method of testing and coupling a plurality of optoelectronic devices having a coating on their output facets designed to reduce reflectance when the optoelectronic devices are in optical communication with a first medium (e.g., air) at a first time and with a second medium (e.g., optical gel) at a second time.

FIG. 6A is a plot of the calculated reflectance for a coating comprising two layers designed to reduce reflectance at the interface between an optical waveguide having an effective refractive index of 3.2 and a medium with a refractive index of 1.

FIG. 6B is a plot of the calculated reflectance for a coating comprising the coating of FIG. 6A with four additional layers, designed to reduce reflectance in the interface between an optical waveguide having an effective refractive index of 3.2 and a medium with a refractive index of 1.5.

FIG. 6C is a plot of the calculated reflectance for a coating comprising the coating of FIG. 6A plus three additional layers, designed to reduce reflectance in the interface between an optical waveguide having an effective refractive index of 3.2 and a medium with a refractive index of 1.5.

DETAILED DESCRIPTION

Figure 1A:
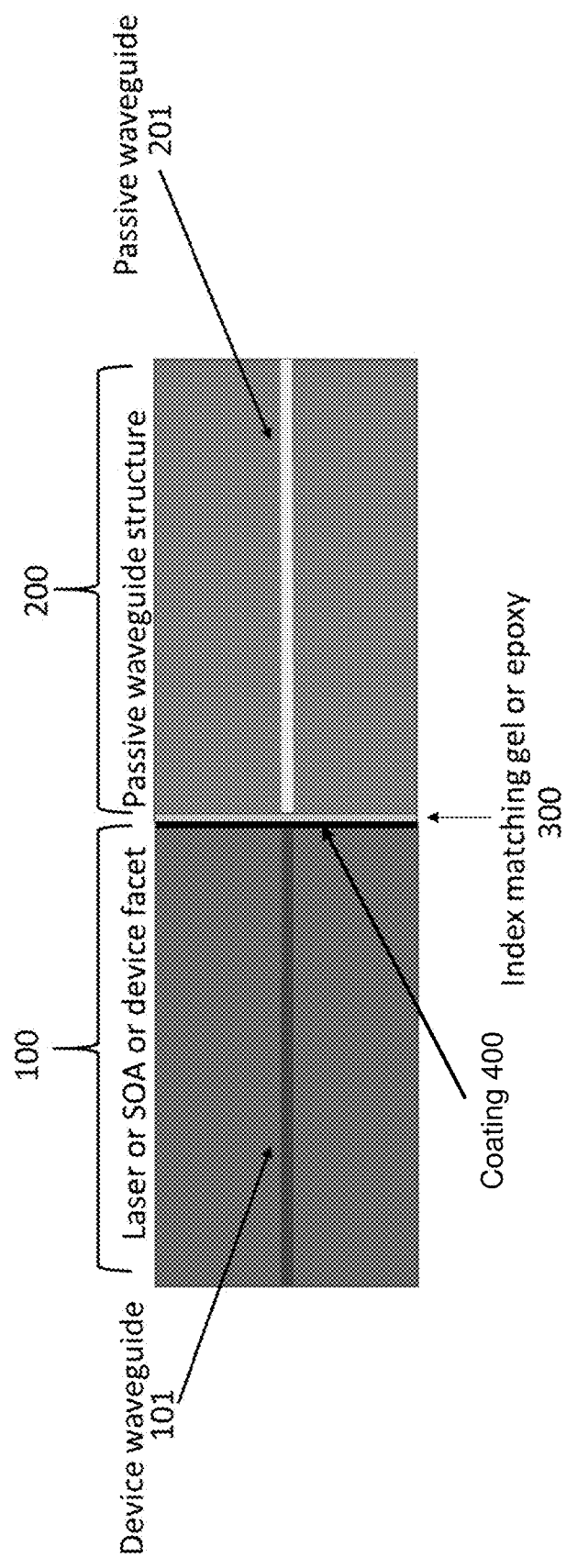
FIG. 1A illustrates an example optical system comprising an optoelectronic device comprising a device waveguide in optical communication with an optical device comprising another waveguide wherein the waveguides are normal to the interface between the optoelectronic device and the optical device.
Figure 1B:
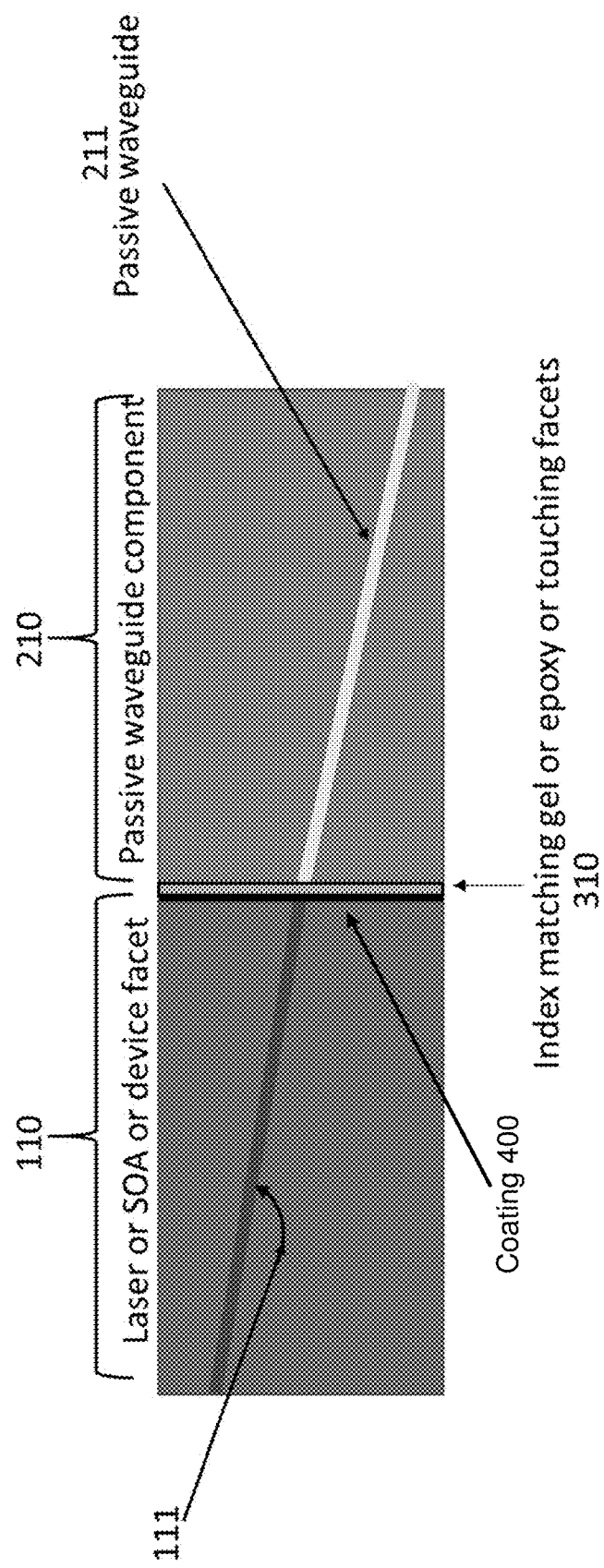
FIG. 1B illustrates an example optical system comprising an optoelectronic device comprising a device waveguide in optical communication with an optical device comprising another waveguide wherein the waveguides are angled to the interface between the optoelectronic device and the optical device.

FIGS. 1A and 1B schematically illustrate example optical systems comprising first optical devices 100, 110 (e.g., a laser such as distributed feedback laser or DFB laser; distributed Bragg reflector laser or DBR laser; a semiconductor optical amplifier (SOA) such as a III-V semiconductor optical amplifier; other device with device facet and the like) configured to generate, transmit, or output optical signals having a predetermined wavelength and/or predetermined wavelength range in accordance with certain embodiments described herein. In some examples, the first optical devices 100,110 may be active optical devices that generate or amplify optical signals, or optoelectronic devices. In some examples, the first optical devices 100, 110 may be passive optical devices that receive optical signals from another optical device. In various embodiments, an optical signal may have a time dependent optical intensity (e.g., a pulse, a sine wave and the like) or have a constant optical intensity. In some cases, the first optical device 100 of FIG. 1A may be in optical communication with another or second optical device or a second optical component 200 an optical waveguide structure) configured to receive the optical signals from the first optical device 100. In some cases, the second optical device 200 may be a passive optical device having an optically passive waveguide, an active optical device having an optically active waveguide, or an optoelectronic device. For example, an output facet of a first device waveguide 101 of the first optical device 100 may be coupled to (e.g., be in optical communication with) an input facet of another (second) waveguide 201 (e.g., a passive waveguide) of the second optical component 200. In some examples, the waveguide 201 of the second optical component 200 may be a passive waveguide comprising, for example, $SiN_x$, $SiO_2$, Si, Glass or other materials. The first device waveguide 101 has an effective refractive index (e.g., 3.2), and the second passive waveguide 201 of the second optical component 200 has a different effective refractive index (e.g., 1.5). (As discussed above, the term refractive index or index of refraction is used herein to include both the refractive index of a material such as a bulk material or medium like air, water, gel or glass as well as the effective refractive index of a waveguide or waveguide structure. Likewise, the terms refractive index, index of refraction, and effective refractive index are used interchangeably herein.) In FIG. 1A, the output facet is substantially normal to the device first waveguide 101 and the input facet is substantially normal to the second passive waveguide 201.

In certain embodiments, the optical device 100 can comprise an intermediate optical medium 300 (e.g., index matching gel or epoxy) positioned between the output facet of the first device waveguide 101 and the input facet of the second waveguide 201. In some examples, the intermediate medium may fill a small gap that may exist between the first device waveguide 100 and the second waveguide 201. In some other examples, the intermediate optical medium may be configured to connect the first device waveguide 101 to the second waveguide 201. In some such examples, the intermediate medium may be configured to reduce optical reflection between the output facet and the input facet (e.g., resulting from a small gap between the optical device 100 and the passive waveguide structure 200). In some cases, the intermediate optical medium 300 may be selected to have a refractive index that is matched to the effective refractive index of the second waveguide 201 (e.g., such that there is negligible or minimal reflection of the optical signals at the interface of the output facet of the first device waveguide 101 and the input facet of the second waveguide 201). In some other cases, the intermediate optical medium 300 may be selected to have a refractive index that is larger than the effective refractive index of the second waveguide 201 but smaller than the effective refractive index of the first device waveguide 101.

In the example optical system illustrated in FIG. 1B, the first optical device 110 may be in optical communication with a second optical component 210 configured to receive the optical signals from the first optical device 110. In certain embodiments, the first optical device 110 and the second optical component 210 can comprise a pair of optoelectronic devices (e.g., a first laser and a second laser; a first III-V semiconductor component and a second III-V semiconductor component; a laser and a passive waveguide; a laser and at least one planar lightwave circuit (PLC), optoelectronic component, or a passive optical waveguide circuit). In some examples, such as the one illustrated in FIG. 1B, the output facet of the first optical device 110 (that is parallel to the input facet of the second optical component 210) may be angled (e.g., non-normal) to the device waveguide 111 of the first optical device 110, and the input facet of the second optical component 210 is correspondingly angled (e.g., non-normal) to the waveguide 211 of the second optical component 210 such that back reflections from the facets, the interface between facets, or an intermediate medium between the facets are inhibited (e.g., prevented, reduced, minimized, not well coupled, etc.) into either the first optical device 110 and/or second the optical component 210.

In certain embodiments, the optical system may comprise an intermediate optical medium 310 (e.g., index matching gel or epoxy) positioned between the output facet of the first optical device 110 and the input facet of the second optical component 210 and configured to connect the first device waveguide 111 to the second passive waveguide 211 (e.g., across a small gap that may exist between the first optical device 110 and the second optical component 210). In certain embodiments, the output facet and the input facet may be at least partially in physical contact. In some implementations, the intermediate optical medium 310 can be selected to have a refractive index that is matched to the effective refractive index of the second waveguide 211 (e.g., such that there is negligible or minimal reflection of the optical signals at the interface of the output facet of the first device waveguide 111 and the input facet of the second waveguide 211). In some other cases, the intermediate optical medium 310 may be selected to have a refractive index that is larger than the effective refractive index of the second waveguide 211 but smaller than the effective refractive index of the first device waveguide 111).

Figure 2A:
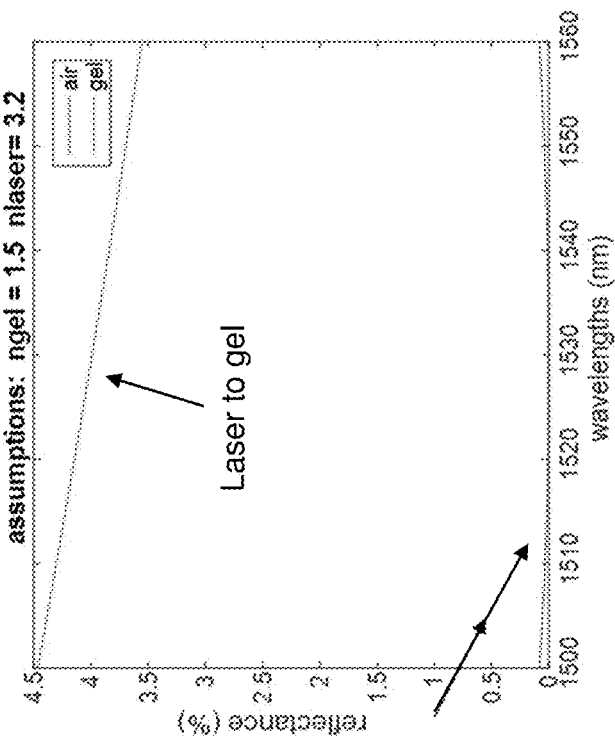
FIG. 2A is a plot of the calculated reflectance as a function of wavelength for a two-layer anti-reflection coating on the output facet of device waveguide having a refractive index of 3.2 in optical communication with an optical medium (e.g., air) having a refractive index of 1.
Figure 2B:
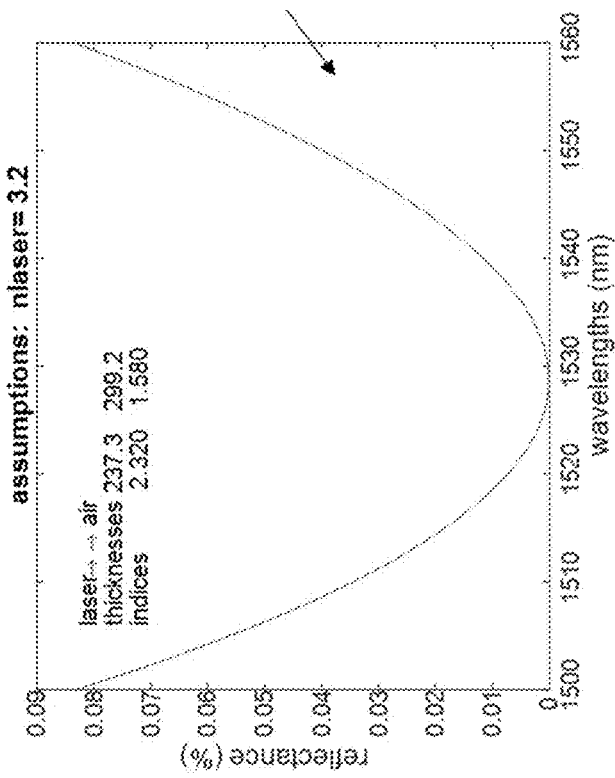
FIG. 2B is a plot of the calculated reflectance as a function of wavelength for the two-layer anti-reflection coating of FIG. 2A on the output facet of device waveguide having a refractive index of 3.2 in optical communication with an optical medium (e.g., optical gel) having a refractive index of 1.5.

For conventional optical devices and systems, the output facet of the first device waveguide 101, 111 may comprise a coating (e.g., an anti-reflection coating) that is configured to inhibit (e.g., prevent, reduce, or minimize, etc.) reflections of optical signals at the interface with only a single optical medium possible for a given wavelength range. For example, the coating may be designed (e.g., optimized) for g reducing reflection of optical signals transmitted from the first optical medium of the optical device 100, 110 to only the second optical medium of the optical component 200, 210. In some examples, an anti-reflection coating may comprise one or more layers. The refractive index and the thickness of different layers may be selected to reduce the reflection in a given wavelength range. For example, FIG. 2A is a plot of a simulation of the reflectance (e.g., reflectivity) as a function of wavelength for a two-layer anti-reflection coating, deposited on an output facet of a first optical device 100, 110 (e.g., a laser), configured (e.g., designed or optimized) to reduce or minimize reflections at 1530 nm wavelength from the output facet of the device waveguide 101, 111 of the first optical device 100, 110 having an effective refractive index of 3.2 in optical communication with a second optical medium (e.g., air) having a refractive index (e.g., effective refractive index) of 1. As shown in FIG. 2A, the reflectance (the portion of the optical power or intensity reflected back to the first optical device 100, 110) has be reduced or optimized so as to have a minimum at or near a wavelength of 1530 nm and is well below 0.05% for a range of wavelengths (e.g., from 1510 nm to 1550 nm) and is well below 0.1% for a broader range of wavelengths (e.g., from 1500 nm to 1560 nm). However, FIG. 2B is a plot of a simulation of the reflectance as a function of wavelength for the same optical device having the same two-layer anti-reflection coating (on the output facet of its device waveguide), of FIG. 2A, but now being in optical communication with a second optical medium (e.g., an optical gel) that instead has an refractive index (e.g., effective refractive index) greater than one (e.g., equal to 1.5). As seen in FIG. 2B, the reflectance for the same optical device with the same anti-reflection coating is much higher (e.g., between 4.5% and 3.5% in the same wavelength range of 1500 nm to 1560 nm) when the second optical medium receiving the optical signal is an optical gel than when the second optical medium is air (also plotted in FIG. 2A for comparison). Thus, for an optical signal transmitted from the first device waveguide of a first optical device to an optical medium of an environment, the reflection at the output facet of the first optical device can be significantly different when the second optical medium receiving the optical signal is air or vacuum (e.g., refractive index near 1.0) as compared to when the second optical medium receiving the optical signal is an index matching gel or epoxy (e.g., refractive index equal to about 1.5).

In some implementations, the difference between the reflectance from a facet of an optical device having a coating when in optical communication with different second optical media can be problematic (e.g., by affecting performance of the optical device). In such implementations, when an optical device has to be tested in a first environment comprising a first optical medium and then being interfaced with a second optical medium (e.g., optical gel or epoxy) in an optical system, the measurements of the optical device prior to interfacing with the second optical medium may be much less useful (e.g., due a change of performance of the optical device in presence of different levels of reflectivity). For example, in some applications, careful testing of an optical device (e.g., photonic integrated circuit, laser, modulator, passive waveguide device) can be performed prior to integration of the optical device into a larger optical system by placing the optical device in optical communication with, for example, a passive waveguide. Unfortunately, when tested in a lab environment with the second optical medium being ambient air, the optical device behaves differently compared to when the optical device is coupled to the passive waveguide structure because the reflectance of the facet is different in air than it is in a gel or epoxy (e.g., as shown in FIGS. 2A and 2B). In some conceivable examples, the passive waveguide can have effective refractive indices varying from 1.2 to 2.5, and the optical device can have refractive indices varying from 2.5 to 4.0. (As discussed above, the term refractive index or index of refraction is used herein to include both the refractive index of a material such as a bulk material or medium like air, water, gel or glass as well as the effective refractive index of a waveguide or waveguide structure. Likewise, the terms refractive index, index of refraction, and effective refractive index are used interchangeably herein.)

In contrast, in certain embodiments described herein, the first optical device 100, 110 (e.g., laser, optoelectronic device, etc.) is configured to have similar, nearly similar, or identical performances (e.g., is configured to function optimally) when in optical communication with two different optical media (e.g., corresponding to two different environments). For example, certain embodiments described herein can advantageously be used for an optical device 100, 110 that is configured to be used in two different optical media (e.g., in both air and water). For another example, certain embodiments advantageously provide an optical device 100, 110 that is configured to be tested in a first optical medium (e.g., air) for quality control, and later assembled such that the optical device's 100, 110 output facet is not coupled to the first optical medium, but instead to a second optical medium (e.g., gel or epoxy) with a refractive index different from the refractive index of the first optical medium.

In certain embodiments described herein, the optical device 100, 110 comprises a coating 400 that is designed (e.g., optimized) to reduce reflectance of the output facet of an optical device by the same level or nearly same level when it is in optical communication with multiple optical media (e.g., for operation in an ambient air environment and in an environment having a higher refractive index). In certain embodiments, the reflectances when the output facet of the optical device is in communication with multiple optical media or environments may be negligibly different or a difference within a margin or such difference can be minimized. In certain other embodiments, the coating may be designed to provide reduced, negligible, or minimum reflectances when in optical communication with multiple optical media (e.g., multiple environments), wherein a difference between these reflectances is maintained within a given margin (for example a reduced, or small or negligible margin). The coating 400 for certain embodiments may comprise a plurality of dielectric layers, including but not limited to any one or combination of the following: $Ta_2O_5$, $TiO_2$, $Al_3O_2$, $SiO_2$, ZnSe, or $MgF_2$. The coating may comprise an interference film. For example, the coating may comprise a quarter-wave stack. The number of layers can vary between 1 and any arbitrary number, however the algorithm (e.g., minimization algorithm) used to design the coating may be executed faster (e.g., converge more rapidly possibly in the presence of fewer local minima) when the coating comprises 7 layers or less (e.g., between 1 and 7 layers). The number of layers, however, may be larger. Accordingly, the number of layers may be 1, 2, 3, 4, 5, 6, 7, 8, 9, 10, 11, 12, or any range between any of these values or outside such ranges as well. Similarly, other materials may also be used. In some embodiments, including a wide (e.g., larger) variety of materials and/or a wide (e.g., larger) a number of materials, may result in coatings with better performance within broader wavelength ranges (e.g., similar to coatings designed or optimized to reduce reflectance when put in optical communication with only one optical media having one refractive index). In some embodiments, the designed coatings and the related fabrication and testing methods, may be used to reduce the reflectance between interfaces (e.g., between facets of optical chips when interfacing chips) where the waveguides and facets are normal to one another (e.g., example in FIG. 1A) or for optical interfaces where the waveguides and facets are angled (e.g., non-normal) to one another (e.g., FIG. 1B).

Figure 3:
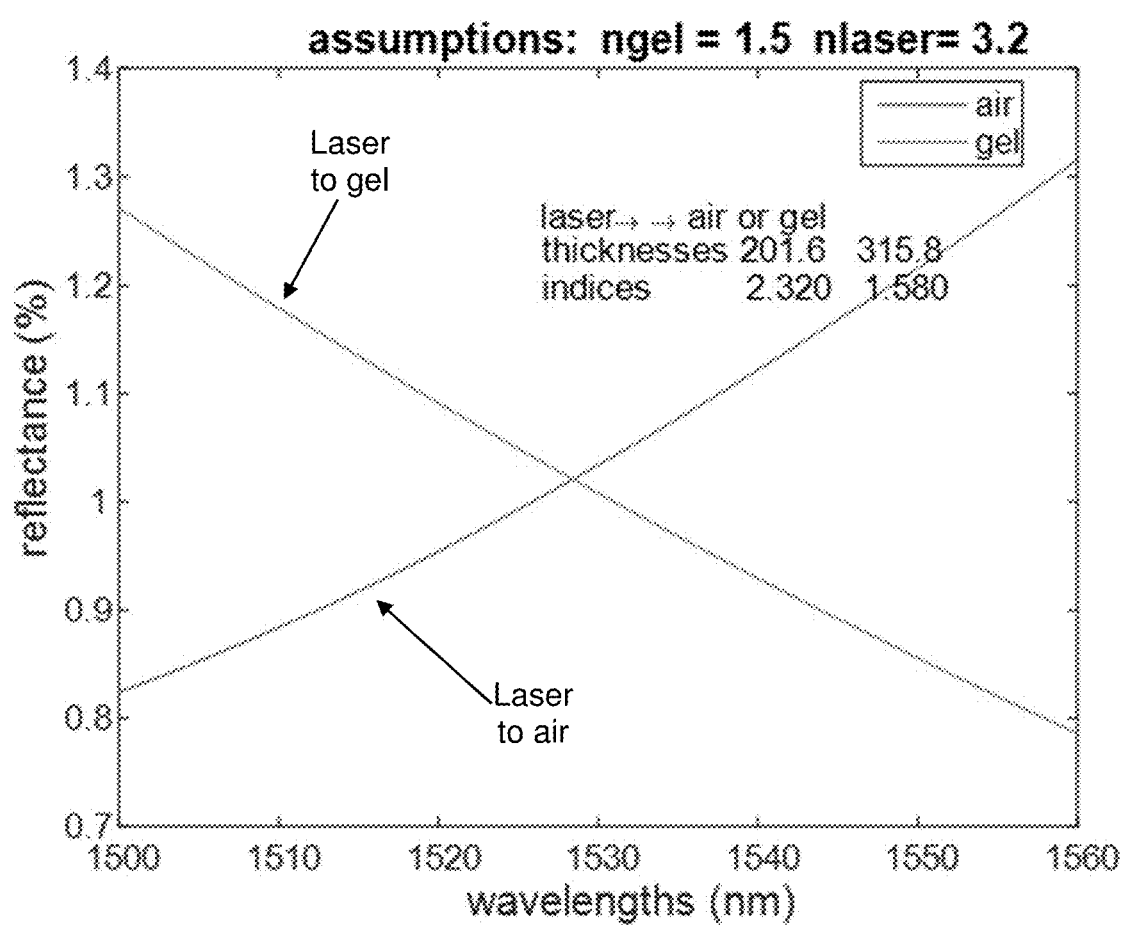
FIG. 3 is a plot of the calculated reflectances as a function of wavelength for a two-layer anti-reflection coating on the output facet of device waveguide having a refractive index of 3.2 in optical communication with a first optical medium (e.g., air) having a refractive index of 1 and a second optical medium (e.g., optical gel) having a refractive index of 1.5.

FIG. 3 is a plot of an example simulation of the reflectance as a function of wavelength for a first optical device 100, 110 comprising a coating 400 configured to reduce or optimize the reflectance for two optical media in accordance with certain embodiments described herein. The first optical medium of FIG. 3 has a refractive index of about 1 and is referred to as "air" and the second optical medium of FIG. 3 has a refractive index of about 1.5 and is referred to as "gel," although other second optical medium materials (e.g., glass, epoxy, etc.) can have a similar refractive index. To generate the simulation shown in FIG. 3, the coating 400 was designed or optimized using an algorithm to optimize (e.g., minimize) or reduce the reflectance for both optical media using the same design. The example coating 400 of FIG. 3 resulting from this optimization or design process comprises a first layer on the facet, the first layer comprising $TiO_2$ (refractive index of about 2.32) and having a first thickness of about 200 nanometers, and a second layer on the first layer, the second layer comprising $Al_2O_3$ (refractive index of about 1.58) and having a thickness of about 316 nanometers.

As shown in FIG. 3, the reflectance for each of the two optical media for this example simulation is between about 0.8% and 1.3% across a wavelength range of 1500 nm to 1560 nm. The "gel" interface reflectance of FIG. 3 for the coating 400 optimized or designed to reduce reflection for operation with both optical media is nearly a factor of 4 improved (e.g., reduced) as compared to the "gel" interface reflectance for which the coating was optimized or designed only for air (see, e.g., FIG. 2B). As compared to the "air" interface reflectance of FIGS. 2A and 2B, the "air" interface reflectance of FIG. 3 represents a tradeoff or compromise in which the "air" interface reflectance has increased while the "gel" interface reflectance has been advantageously decreased. Although the "air" interface reflectance of FIG. 3 is larger than the "air" interface reflectance of FIG. 2A and FIG. 2B, the "air" interface reflectance is still sufficiently low (e.g., in a range of 0.8% to 1.3%) for operation (e.g., testing) of the optical device 100. In a narrower wavelength range (e.g., 1525 nm to 1535 nm), the reflectance is very close to 1% for both the "air" interface and the "gel" interface.

Figure 4:
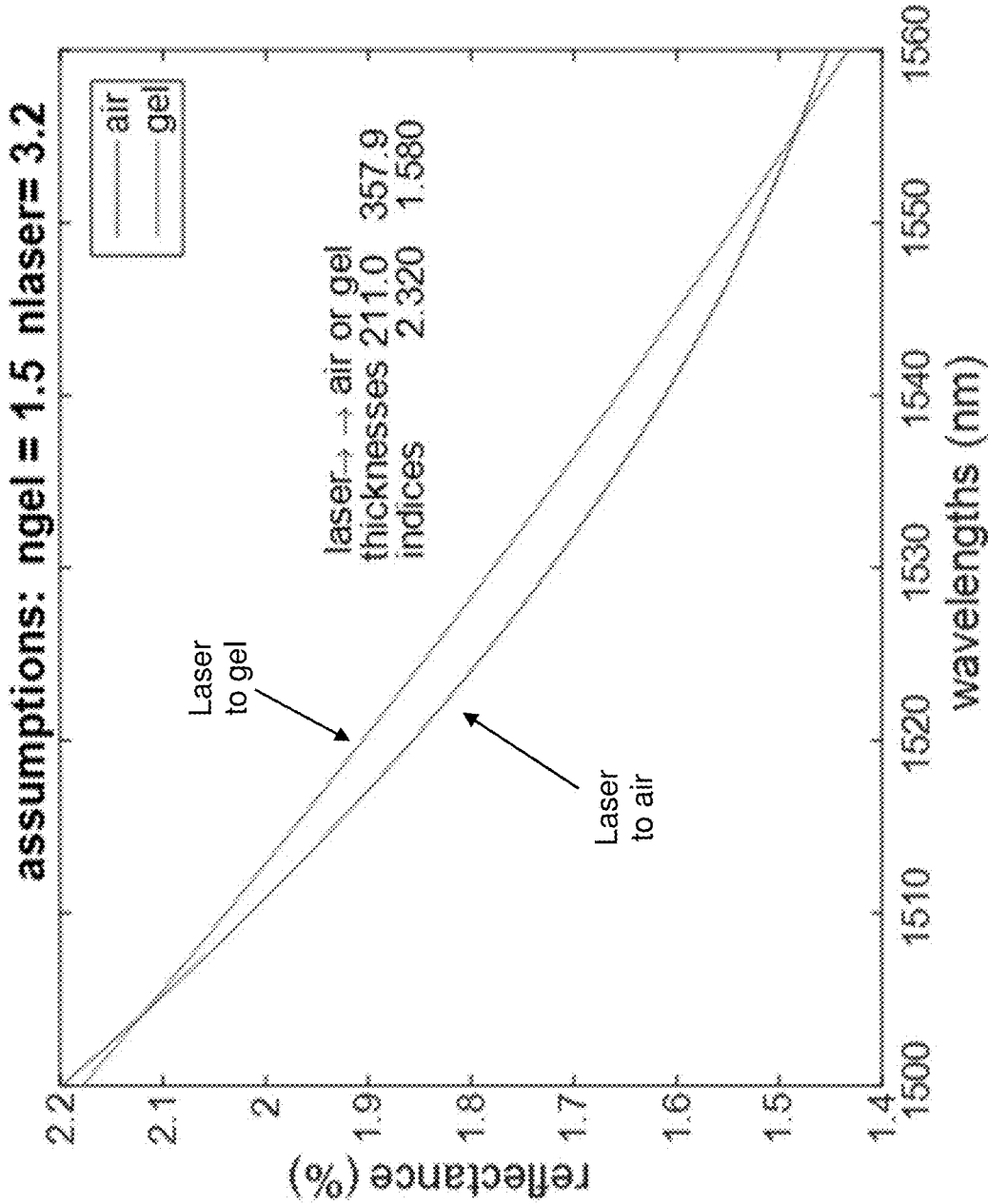
FIG. 4 is a plot of the calculated reflectances as a function of wavelength for a two-layer anti-reflection coating on the output facet of device waveguide having a refractive index of 3.2 in optical communication with a first optical medium (e.g., air) having a refractive index of 1 and a second optical medium (e.g., optical gel) having a refractive index of 1.5.

FIG. 4 is a plot of an example simulation of the reflectance as a function of wavelength for a first optical device 100, 110 comprising a coating 400 configured for low reflectance for two optical media in accordance with certain embodiments described herein. The first optical medium of FIG. 4 has a refractive index of about 1 and is referred to as "air" and the second optical medium of FIG. 4 has a refractive index of about 1.5 and is referred to as "gel," although other second optical medium materials (e.g., glass, epoxy, etc.) can have a similar refractive index. The example coating 400 of FIG. 4 resulting from the optimization or design process comprises a first layer on the facet, the first layer comprising $TiO_2$ (refractive index of about 2.32) and having a first thickness of about 210 nanometers, and a second layer on the first layer, the second layer comprising $Al_2O_3$ (refractive index of about 1.58) and having a thickness of about 358 nanometers.

As shown in FIG. 4, the "air" interface reflectance and the "gel" interface reflectance for this example simulation are substantially equal to one another (e.g., within ±20%; within ±10%; within ±5%) across a predetermined wavelength range (e.g., 1500 nm to 1560 nm). For example, the coating 400 of FIG. 4 can be used for a first optical device 100, 110 comprising a tunable laser integrated with an output SOA. The first optical device 100, 110 can have the same level or virtually the same (e.g., to within 0.2%, 0.15%, 0.1% or 0.08% or 0.05%) of back reflection from the output facet over the entire band of wavelengths shown (e.g., at least 50 nm or 60 nm) when operated in either of the two optical media (e.g., air and index matching gel or epoxy). Advantageously, when the first optical device 100, 110 is coupled to another second device, it would exhibit the same characteristics whether it is coupled via a "gel" or an "air" interface.

While the simulations of FIG. 3 and FIG. 4 are examples, the methodology of reducing or minimizing reflections and/or reducing or minimizing reflectance differences for a facet coating 400 in two different optical media (e.g., air and an index matching gel or epoxy), such a methodology can be extended to any applicable optoelectronic device 100, 110 using any coating deposition process with controllable layer thicknesses. The number of layers of the coating 400 can be arbitrarily large and can comprise one material for a one-layer coating 400, two materials for a coating 400 comprising two or more layers, or more than two materials for a coating 400 with more than two layers. While FIGS. 3 and 4 show an example wavelength range with a width of about 60 nm centered at a wavelength around 1530 nm, other wavelength ranges can also be used, including but not limited to: 300 nm to 400 nm, 400 nm to 500 nm, 500 nm to 600 nm, 600 nm to 700 nm, 800 nm to 900 nm, 1000 nm to 1200 nm, 1200 nm to 1400 nm, 1400 nm to 1600 nm, 1600 nm to 1800 nm, 1900 nm to 2000 nm, 2 microns to 4 microns, and 4 microns to 10 microns or any range formed by any of these values. The width of the wavelength range can be at least 20 nm, 30 nm, 40 nm, 50 nm, 60 nm, 70 nm, 80 nm, 90 nm, 100 nm, 110 nm, 120 nm, 130 nm, 140 nm, 150 nm, 175 nm, 200 nm, 250 nm, 300 nm, 350 nm, 400 nm, 450 nm, 500 nm, or any range between any of these values. Likewise, the wavelengths can be in any range of wavelengths such as in the wavelength ranges from 300 nm to 400 nm, 400 nm to 500 nm, 500 nm to 600 nm, 600 nm to 700 nm, 800 nm to 900 nm, 1000 nm to 1200 nm, 1200 nm to 1400 nm, 1400 nm to 1600 nm, 1600 nm to 1800 nm, 1900 nm to 2000 nm, 2 microns to 4 microns, 4 microns to 10 microns or any range formed by any of these values. The difference in reflectance (in %) or other parameter (e.g., transmittance) for the first and second mediums having different refractive index (e.g., the difference between the first and second reflectances for the first and second mediums) can be equal to or less than ±5%, ±4%, ±3%, ±2%, ±1%, ±0.5%, ±0.2%, ±0.1%±0.08%, ±0.06%, ±0.05%, ±0.04%, ±0.03%, ±0.02%, ±0.01%, ±0.005%, ±0.001% or any range between any of these values. This difference (e.g., in reflectance) may be at one wavelength in the range of wavelengths, may be an average difference across the wavelength range, or may include most (e.g., at least 50%, 60%, 70%, 80%, 90% or 95% or more) or all the wavelengths across the wavelength range. The difference in the index of refraction between the first and second mediums can be at least ±1.5, ±1.4, ±1.3, ±1.2, ±1.1, ±1, ±0.9, ±0.8, ±0.7, ±0.6, ±0.5, ±0.4, ±0.3, ±0.2, ±0.1, ±0.05 or any range between any of these values. Such performance may be designed for normal angles of incidence with respect to the interface or for other angles. The performance may be applicable for a ranges of angles of at least ±0.05°, ±0.1°, ±0.2°, ±0.5°, ±1°, ±2°, ±3°, ±4°, ±5°, ±8°, ±10°, ±15°, ±18°, ±20°±25°, ±30° or any range formed by any of these values. Designing the coating 400 to reduce reflectance in two optical media in accordance with certain embodiments described herein is not only applicable to anti-reflection coatings or to coating designed to reduce or minimize reflectance (e.g., reducing reflectances to near or at 0%), but can be performed for partially reflective coatings and/or high reflection coatings (e.g., designed to have reflectances in a range including but not limited to: 1% to 5%; 5% to 10%; 10% to 25%; 15% to 20%, 25% to 50%; 25% to 35%, 35% to 45%, 50% to 75%; 55% to 65%, 70% to 80%, 80% to 90%, 75% to 99%, 90% to 100% or any range formed by any of these values). In such cases, for example, the difference in reflectance (in percent) or other parameter (e.g., transmittance), for the two media (e.g., the difference between the first and second reflectances for the first and second reflectances) can be less than or equal to ±5%, ±4%, ±3%, ±2%, ±1%, ±0.5%, ±0.2%, ±0.1%±0.08%, ±0.06%, ±0.05%, ±0.04%, ±0.03%, ±0.02%, ±0.01%, ±0.005%, ±0.001% or any range between any of these values. This difference (e.g., in reflectance) may be at one wavelength in the range of wavelengths, may be an average difference across the wavelength range, or may include most (e.g., at least 50%, 60%, 70%, 80%, 90% or 95% or more) or all the wavelengths across the wavelength range. The difference in the index of refraction (e.g., between the first and second mediums) can be at least ±1.5, ±1.4, ±1.3, ±1.2, ±1.1, ±1, ±0.9, ±0.8, ±0.7, ±0.6, ±0.5, ±0.4, ±0.3, ±0.2, ±0.1, ±0.05 or any range between any of these values. The width of the wavelength range can be at least 20 nm, 30 nm, 40 nm, 50 nm, 60 nm, 70 nm, 80 nm, 90 nm, 100 nm, 110 nm, 120 nm, 130 nm, 140 nm, 150 nm, 175 nm, 200 nm, 250 nm, 300 nm, 350 nm, 400 nm, 450 nm, 500 nm, or any range between any of these values. The wavelengths can be in any range of wavelengths such as in the ranges 300 nm to 400 nm, 400 nm to 500 nm, 500 nm to 600 nm, 600 nm to 700 nm, 800 nm to 900 nm, 1000 nm to 1200 nm, 1200 nm to 1400 nm, 1400 nm to 1600 nm, 1600 nm to 1800 nm, 1900 nm to 2000 nm, 2 microns to 4 microns, 4 microns to 10 microns or any range formed by any of these values. Such performance may be designed for normal angles of incidence with respect to the interface or for other angles. The performance may be applicable, for example, for a ranges of angles of at least ±0.05°, ±0.1°, ±0.2°, ±0.5°, ±1°, ±2°, ±3°, ±4°, ±5°, ±8°, ±10°, ±15°, ±18°, ±20°±25°, ±30° or any range formed by any of these values.

In certain embodiments, the methodology of coating optimization can include "brute-force" calculation of a wide range of thicknesses for each layer in the coating with comparison at different points (e.g., each point) to a desired result, or can use faster, more sophisticated approaches (e.g., such as the Marquardt Levenberg algorithm to fit to a curve or find a minimum or other approaches). The target of such optimization need not be a particular reflectance or curve, but can be reduction or minimization of the sum of reflectances or other figure of merit including contribution of reflectances (or other parameter, transmittance or otherwise) calculated for the plurality of optical media, or can be reduction or minimization of a more complicated relationship of the reflectances. For example, the function of the reflectances to be reduced or minimized can be $X=(R_1+R_2)$, where X is a function of wavelength, $R_1$ is the reflectance as a function of wavelength for a first optical medium with a first refractive index, and $R_2$ is the reflectance as a function of wavelength for a second optical medium with a second refractive index. For another example, the function of the reflectances to be reduced or minimized can be $X=(R_1+R_2)^2+W*|R_1-R_2|$, where X is a function of wavelength, $R_1$ is the reflectance as a function of wavelength for a first optical medium with a first refractive index, $R_2$ is the reflectance as a function of wavelength for a second optical medium with a second refractive index, and W is a weight array defined as the difference (e.g., $(\lambda-\lambda_{center})^2$) between any wavelength $\lambda$ in the calculation range and the center wavelength $\lambda_{center}$ of the range, where $\lambda_{center}=(\min(\lambda)+\max(\lambda))/2$. As discussed above, different parameters such as transmittance or others can be considered in addition or in alternative. Other optimizations or processes are also compatible with certain embodiments described herein to achieve the desired relationship between reflections in the two or more optical media.

FIG. 5A/5B/5C illustrate three flow diagrams for example methods of testing one or more optoelectronic devices having a facet (e.g., output facet) and a coating 400 on the facet designed for reducing the reflectance to a low level reflectance within a certain margin when the output facet is in optical communication with a first or second optical medium in accordance with certain embodiments described herein. The methods shown in flow diagrams of FIG. 5A/5B/5C can be example sequences by which a laser, photonic integrated circuit, or other optoelectronic devices can be tested in air for performance (e.g., optical performance, optoelectronic performance, current-voltage characterization, current-optical power characterization and similar tests), such that optoelectronic devices not satisfying certain threshold conditions can be scrapped, or alternatively, binned to a different specification of performance based on the testing in air. Later, when integrated into a new optical system wherein they are in optical communication with a non-air interface (e.g., optical gel), the optoelectronic devices may have characteristics (e.g., optical and/or optoelectronic characteristics) similar or close to the characteristics measured in air.

FIG. 5A is a flow diagram for an example method of testing, mounting and coupling a plurality of optoelectronic devices having a coating on their output facet designed to reduce reflectance or have another desired reflectance or performance characteristic when the optoelectronic devices are in optical communication with a first medium (e.g., air) at a first time and a second medium (e.g., optical gel) at a second time, wherein the plurality of the optical devices are tested before and after being mounted on a chip-on-chip (COC) assembly. At block 502, an optoelectronic bar, comprising a plurality of optoelectronic devices with coating on their output facets, is tested when the bar is within a wafer and its facet (e.g., the facet comprising output facets of the corresponding optoelectronic devices) is exposed to air. In some examples, the test may comprise characterization (e.g., optical and/or optoelectronic characterization) of one or more optoelectronic devices included in the bar. At block 504 if the bar passes the test (e.g., one or more optoelectronic devices perform satisfactory according to certain conditions), at block 508 the bar may be singulated (separated from the chip), mounted (or bonded) to COC. At block 510 the bar may be tested again. If the mounted bar passes the second test at block 510, at block 514 the COC that carries the bar may be coupled to one or more optical or optoelectronic devices (e.g., mounted on another chip) using, for example, an optical gel and become part of an optical system. In some examples, when the COC is coupled, the output facet of one or more optoelectronic devices within the bar may be in optical communication with other optical devices via an optical gel. If at block 504 or 510 one or more optoelectronic devices fail the test (e.g., their measured performance does not satisfy a threshold condition), the bar may be discarded.

FIG. 5B is a flow diagram for an example method of testing and coupling an optoelectronic device having a coating on its output facet designed to reduce reflectance or have another desired reflectance or performance characteristic when optoelectronic device is in optical communication with a first medium (e.g., air) at a first time and a second medium (e.g., optical gel) at a second time. The procedures at block 502 and 504 can be similar or identical to the procedures described for the same blocks in FIG. 5A. In some examples, at block 509 a chip comprising a single optoelectronic device that has passed the test at block 504 may be singulated (e.g., diced, separated) from the bar. At block 511 the singulated chip (e.g., the optoelectronic device on the chip) is tested for a second time as an individual device. If the chip passes the second test at block 511, at block 515 the chip may be coupled to one or more optical or optoelectronic devices (e.g., mounted on another chip) using, for example, an optical gel and become part of an optical system. In some examples, when the chip is coupled, the output facet of the optoelectronic device on the chip be in optical communication with another optical device via an optical gel. If at block 511 the optoelectronic device on chip fails the test (e.g., its measured performance does not satisfy a threshold condition), the chip may be discarded. In some examples, the procedures described for block 509, 511 and 515 may be repeated for all chips included in a bar.

FIG. 5C is a flow diagram for an example method of testing and coupling plurality of optoelectronic devices having a coating on their output facet designed to reduce reflectance or have another desired reflectance or performance characteristic when optoelectronic devices are in optical communication with a first medium (e.g., air) at a first time and a second medium (e.g., optical gel) at a second time. The procedures at block 502 and 504 can be similar or identical to procedures described for the same blocks in FIG. 5A. In some examples, if the bar passes the test at block 504, at block 516 the chips are singulated from the bar may be coupled to one or more optical or optoelectronic devices (e.g., mounted on another chip) using, for example, an optical gel and become part of an optical system. In some examples, when a chip is coupled, the output facet of the optoelectronic device on the chip be in optical communication with another optical device via an optical gel. If at block 504 a chip in the bar fails the test (e.g., its measured performance does not satisfy a threshold condition), the chip may be discarded. In some examples, these procedures may be repeated for all chips included in a bar.

In some examples, the coating disposed on the facet (e.g., output facet) of the optoelectronic devices described in FIG. 5A/5B/5C may be designed or configured to provide a first reflectance when the facet is in optical communication with a first optical medium during a first time period and a provide a second reflectance when the facet is in optical communication with a second optical medium during a second time period. In some such examples, the first optical medium may have a first refractive index and the second optical medium may have a second refractive index different from the first refractive index. In some examples, the second reflectance (measured in percentage) as a function of wavelength may within ±0.001%, ±0.005%, ±0.01%, ±0.05%, ±0.1%, ±0.5%, ±1%, ±2%, ±3%, ±5%, ±7%, ±10%, of the first reflectance (measured in percentage) for optical signals having at least one wavelength in the predetermined wavelength range. In some implementations, the second reflectance (measured in percentage) may alternatively or in addition be within 0.001%, ±0.005%, ±0.01%, ±0.05%, ±0.1%, ±0.5%, ±1%, ±2%, ±3%, ±5%, ±7%, ±10%, of the first reflectance (measured in percentage) when averaged across a wavelength range. In some implementations, the second reflectance (measured in percentage) may alternatively or in addition be within 0.001%, ±0.005%, ±0.01%, ±0.05%, ±0.1%, ±0.5%, ±1%, ±2%, ±3%, ±5%, ±7%, ±10%, to the first reflectance (measured in percentage) for the wavelengths across a wavelength range. As discussed above the wavelength range can be at least 20 nm, 30 nm, 40 nm, 50 nm, 60 nm, 70 nm, 80 nm, 90 nm, 100 nm, 110 nm, 120 nm, 130 nm, 140 nm, 150 nm, 175 nm, 200 nm, 250 nm, 300 nm, 350 nm, 400 nm, 450 nm, 500 nm, or any range between any of these values. The wavelengths can be in any range of wavelengths such as in the ranges 300 nm to 400 nm, 400 nm to 500 nm, 500 nm to 600 nm, 600 nm to 700 nm, 800 nm to 900 nm, 1000 nm to 1200 nm, 1200 nm to 1400 nm, 1400 nm to 1600 nm, 1600 nm to 1800 nm, 1900 nm to 2000 nm, 2 microns to 4 microns, 4 microns to 10 microns or any range formed by any of these values. The difference between the first and second refractive indices of the first and second mediums can have a magnitude or absolute value of the difference of at least 1.5, 1.4, 1.3, 1.2, 1.1, 1, 0.9, 0.8, 0.7, 0.6, 0.5, 0.4, 0.3, 0.2, 0.1, 0.05 or any range between any of these values. Such performance may be designed for normal angles of incidence with respect to the interface or for other angles. The performance may be applicable, for example, for a ranges of angles of at least ±0.05°, ±0.1°, ±0.2°, ±0.5°, ±1°, ±2°, ±3°, ±4°, ±5°, ±8°, ±10°, ±15°, ±18°, ±20°±25°, ±30° or any range formed by any of these values. In some examples, the coating disposed on the facet (e.g., output facet) of the optoelectronic devices described in FIG. 5A/5B/5C may be a multilayer coating (e.g., 2, 3, 4, 6, 8, or larger number of layers).

In certain embodiments, the coating 400 may be designed to reduce reflectance when the facet on which the coating is disposed or deposited is in optical communication with three or four different optical media having three or four different refractive indexes. In certain embodiments, the designing of a coating 400 for more than one optical medium is used for testing and screening in one optical medium, and then using the optical device 110, 110 in another different optical medium. In certain embodiments, the designing of a coating 400 for more than one optical medium is used for an optical device 110, 110 that will experience two or more optical media in the field during its application. One such example would be an optical device 110, 110 (e.g., laser, SOA, passive or active waveguide circuit, photonic integrated circuit) that is to be operated both in air and underwater within its lifetime. As discussed above, however, in some cases, the coating 400 may be designed to provide a reflectance or other parameter (e.g., transmittance) within a certain range, for example from 5 to 10%, 10% to 20%, 20% to 30%, 30% to 40% or 50% to 60%, 60% to 70%, 70% to 80%, 80% to 90%, 90% to 99% or 99.9% or 99.99% or 99.999% or any range formed by any of these values. Accordingly, in some such cases the coating may be designed for partial reflection or high reflection, depending on the application (as opposed to being an anti-reflection coating).

FIGS. 6A-6C schematically illustrate examples of calculating reflectances as a function of wavelength, for different coatings 400 designed in accordance with certain embodiments described herein to reduce reflectance for optical signals within a designated wavelength range when in optical communication with one or more optical media. FIG. 6A shows an example reflectance for a first coating 400a comprising at least one first layer (e.g., 1 to 6 layers or more layers) designed to reduce a reflectance with an interface to a first optical medium having a refractive index of about 1 (e.g., air). In particular, the first coating 400a of FIG. 6A comprises a first layer on the facet and a second layer on the first layer. The first layer comprises $TiO_2$ (refractive index of about 2.32) and has a first thickness of about 237 nanometers, and the second layer comprises $Al_2O_3$ (refractive index of about 1.58) and has a thickness of about 300 nanometers.

After testing and screening or binning the optoelectronic devices in air, the same device can have an additional at least one layer (e.g., one to ten additional layers or more layers; four additional layers) added to the at least one layer of the first coating to produce a different second coating 400b configured or optimized to reduce or minimize a reflectance with an interface to a second optical medium having a refractive index of about 1.5 (e.g., gel; epoxy; glass). For example, FIG. 6B shows an example reflectance for a second coating 400b comprising the first coating 400a (e.g., the at least one layer therein) and the at least one addition layer in accordance with certain embodiments described herein. In particular, the second coating 400b of FIG. 6B comprises the first and second layers of the first coating 400a of FIG. 6A and four additional layers on the first coating 400a: a third layer comprising $TiO_2$ (refractive index of about 2.32) and having a thickness of about 56 nanometers, a fourth layer comprising $Al_2O_3$ (refractive index of about 1.58) and having a thickness of about 130 nanometers, a fifth layer comprising $TiO_2$ (refractive index of about 2.32) and having a thickness of about 138 nanometers, and a sixth layer comprising $Al_2O_3$ (refractive index of about 1.58) and having a thickness of about 136 nanometers. Though the second coating 400b may not reduce reflectance when interface with air, the second coating 400b, that is thicker than the first coating 400a, is configured or optimized for the different optical medium. While FIGS. 6A and 6B show the reflectance for the first and second coatings 400a, 400b designed to reduce or optimize reflectance when in optical communication with air and gel, respectively, certain other embodiments can be applied to air and any other optical medium or to any other two dissimilar optical media with which the optoelectronic device 100, 110 is expected to be in optical communication with.

FIG. 6C shows another example reflectance for a different second coating 400c comprising the first coating 400a (e.g., the at least one layer) and the at least one additional layer in accordance with certain embodiments described herein. The at least one additional layer of FIG. 6C is different from the at least one additional layer of FIG. 6B. In particular, the second coating 400c of FIG. 6C comprises the first and second layers of the first coating 400a of FIG. 6A and three additional layers on the first coating 400a: a third layer comprising $Al_2O_3$ (refractive index of about 1.58) and having a thickness of about 182 nanometers, a fourth layer comprising $TiO_2$ (refractive index of about 2.32) and having a thickness of about 258 nanometers, and a fifth layer comprising $Al_2O_3$ (refractive index of about 1.58) and having a thickness of about 224 nanometers. The different second coating 400c is configured or optimized to reduce or minimize the "gel" interface reflectance of FIG. 6C at a different wavelength than the wavelength at which the "gel" interface reflectance of FIG. 6B is reduced or minimized by the second coating 400b.

Although the example reflectances of FIGS. 6A-6C are for a wavelength range centered at 1530 nm, the exact coating design can be broader band, narrower band, or can be at any wavelength, including but not limited to those between 300 nm and 10 microns (e.g., 650 nm to 2.1 microns; 1200 nm to 1650 nm or any range formed by any of these values). The shapes of the anti-reflection curves can be tailored other shapes such as for w shapes or u or v shapes, but the methodology of adding additional coating layers may remain the same. In certain embodiments, a cleaning surface preparation may be used prior to depositing the at least one additional layer.

In certain embodiments, the first coating 400a can be a single layer, and the second coating 400b, 400c can be more of the same material or a different material. In certain embodiments, rather than being an anti-reflective coating, the coatings 400a, 400b, 400c may be designed as partially reflecting or highly reflecting coatings. In certain embodiments, the methodology of designing or optimizing the coating can include "brute-force" calculation of a wide range of thicknesses for each layer in the coatings 400a, 400b, 400c with comparison at different points to a desired result, or can use faster, more sophisticated approaches (e.g., such as the Marquardt Levenberg algorithm to fit to a curve or find a minimum). In some embodiments, the target of the coating design or optimization need not be a particular level or value of reflectance or spectral behavior of the reflectance. For example, a coating may be designed to reduce the sum of reflectances calculated for the plurality of optical media to a reduced or negligible value, or can be designed to reduce or minimize a relationship among one or more reflectances (e.g., associated with optical communication with one or more different optical media), examples of which are described herein. In certain embodiments, design or optimization of the reflectance for the first coating 400a, when the first coating is in optical communication with a first optical media, can be adjusted with the adjustment of the design of the second coating 400b, 400c and/or the optimization of the reflectance of the second coating 400b, 400c so as to achieve a target reflectance (e.g., within a designated wavelength range) that remains substantially unchanged or at least changed less after the deposition of the second coating 400b, 400c and when the final combined coating is in optical communication with a second medium. In certain embodiments, the design or optimization of the reflectance for the first coating 400a, can be adjusted or optimized simultaneously with the design or optimization of the reflectance of the second coating 400b, 400c so as to find an optimum for matching and/or minimized curves before and after the deposition of the second coating 400b, 400c. As described above, in some embodiments described herein, the magnitude of the target reflectance may be negligible within a designated wavelength range. Advantageously, first and second coatings that are designed such that the change of reflectance across a range of wavelengths is negligible when the final coating, comprising the second coating on the first coating, is in optical communication with a second medium compared to the reflectance of the first optical medium being in optical communication with a first optical medium having a refractive index different from that of the first optical medium. In some examples, the difference between these reflectances may be negligible within a designated wavelength range. Advantageously, the reflectance resulting from the combination of the first and the second coatings, when in optical communication with a second medium, may be similar or nearly similar to the reflectance of the first coating being in optical communication with a first optical medium having a refractive index different from that of the second optical medium.

Figure 7:
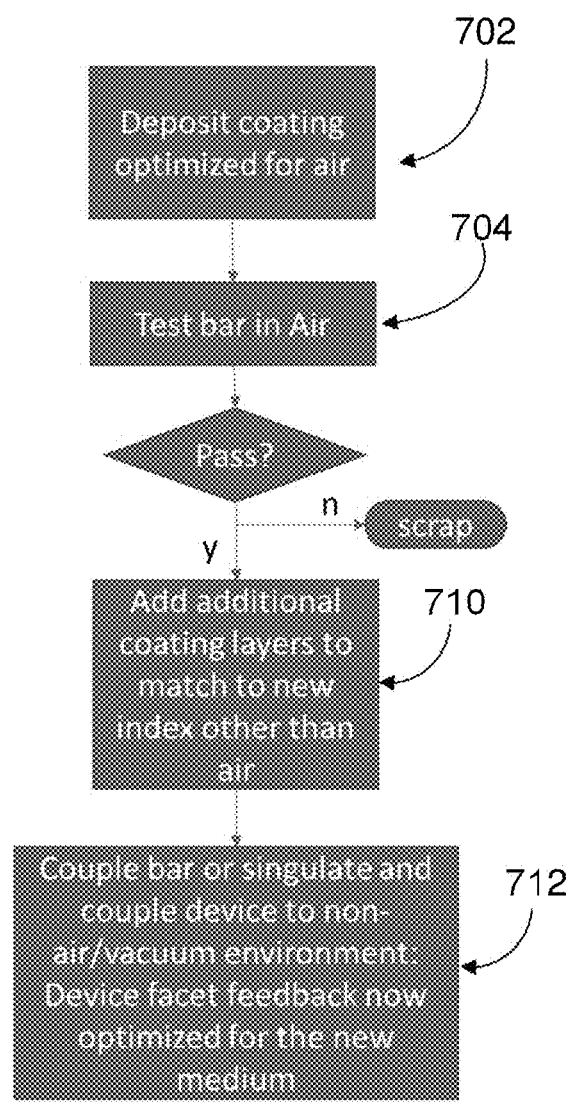
FIG. 7 is a flow diagram for an example method of coating the output facet of one or more optoelectronic devices with two sets of anti-reflection coating layers, wherein the one or more optoelectronic devices are tested in a first medium (e.g., air) before depositing the second set of anti-reflection layers.

FIG. 7 is a flow diagram of an example method for fabricating an optical or optoelectronic device 100, 110 by twice coating a facet of the optical or optoelectronic device 100, 110 in accordance with certain embodiments described herein. The example method of FIG. 7 may comprise depositing a first coating designed to reduce the reflectance of a facet (e.g., an output facet) to a small or negligible level when in optical communication with a first optical medium (e.g., air) for optical signals having wavelengths in a predetermined wavelength range. The method may further comprise, testing the performance of the optoelectronic device 100, 110 in the first optical medium (e.g., when the coated facet is in contact with air) during a first time period.

The method may additionally include, depositing a second coating designed to reduce reflectance when the coated facet (coated with the first and second coatings) is in contact with a second optical medium (e.g., optical gel), and putting the coated facet of the optoelectronic device 100, 110 in contact with the second optical medium. In some examples, the reflectance across the wavelength range when the facet is coated with the first coating and the coated facet is in contact with a first medium may be almost the same as the reflectance when the facet is coated with the first and second coatings and the coated facet is in contact with a second medium having a refractive index different than the first medium. In some examples, each coating may comprise multiple layers.

The example method of FIG. 7 may be used to coat a facet of a bar having plurality of optoelectronic devices or a chip having a single optoelectronic device, test the bar or the chip and couple the bar or the chip to one or more optical or optoelectronic devices. At block 702 a first coating may be deposited on a facet of the bar or the chip (e.g., output facet of one or more optoelectronic devices). At block 704 the bar or the chip may be tested when the coated facet is in optical communication with a first medium (e.g., air). The testing may comprise characterizing the performance of one or more optoelectronic devices (e.g., optical output power as a function of an injected current). If the bar or the chip passes the test (e.g., the performance of one or more optoelectronic devices satisfies certain threshold conditions), at block 710 a second coating may be deposited on top of the first coating. Finally, at block 712, the bar or the chip may be coupled to one or more optical or optoelectronic devices, for example, using an optical gel as in intermediate medium. If at block 704 the bar or the chip do not pass the test the bar or the chip may be scrapped. Accordingly, the chips is assessed for scrapping or binning (e.g., sorting) the optical device 100, 110 according to performance during the testing, then additional layers are deposited to provide a second coating suitable for a second optical medium (e.g., non-air) reflectance (e.g., an optical medium with which the optical device 100, 110 will be in optical communication, such as a final field-use environment).

Accordingly, in various embodiments a first reflectance may be obtained when the optical device having the first coating thereon is in contact with the first medium and a second reflectance may be obtained when the optical device with the first and second coatings thereon is in contact with the second medium. In various implementations, the difference between in this first reflectance and this second reflectance may be small or negligible. In some implementations, for example, the difference in reflectance (in %) or other parameter (e.g., transmittance) for the first and second mediums (e.g., the difference between the first and second reflectances for the first and second reflectances) having different refractive index can be within ±5%, ±4%, ±3%, ±2%, ±1%, ±0.5%, ±0.2%, ±0.1%±0.08%, ±0.06%, ±0.05%, ±0.04%, ±0.03%, ±0.02%, ±0.01%, ±0.005%, ±0.001% or any range between any of these values. This difference (e.g., in reflectance) may be at one wavelength in the range of wavelengths, may be an average difference across the wavelength range, or may include most (e.g., at least 50%, 60%, 70%, 80%, 90% or 95% or more) or all the wavelengths across the wavelength range. The difference in the index of refraction between the mediums can be (e.g., have a magnitude or absolute value of the difference of) at least 1.5, 1.4, 1.3, 1.2, 1.1, 1, 0.9, 0.8, 0.7, 0.6, 0.5, 0.4, 0.3, 0.2, 0.1, 0.05 or any range between any of these values. The width of the wavelength range can be at least 20 nm, 30 nm, 40 nm, 50 nm, 60 nm, 70 nm, 80 nm, 90 nm, 100 nm, 110 nm, 120 nm, 130 nm, 140 nm, 150 nm, 175 nm, 200 nm, 250 nm, 300 nm, 350 nm, 400 nm, 450 nm, 500 nm, or any range between any of these values. The wavelengths can be in any range of wavelengths such as in the wavelength ranges from 300 nm to 400 nm, 400 nm to 500 nm, 500 nm to 600 nm, 600 nm to 700 nm, 800 nm to 900 nm, 1000 nm to 1200 nm, 1200 nm to 1400 nm, 1400 nm to 1600 nm, 1600 nm to 1800 nm, 1900 nm to 2000 nm, 2 microns to 4 microns, 4 microns to 10 microns or any range formed by any of these values. Such performance may be designed for normal angles of incidence with respect to the interface or for other angles. The performance may be applicable for a ranges of angles of at least ±0.05°, ±0.1°, ±0.2°, ±0.5°, ±1°, ±2°, ±3°, ±4°, ±5°, ±8°, ±10°, ±15°, ±18°, ±20°±25°, ±30° or any range formed by any of these values. (As discussed above, the term refractive index or index of refraction is used herein to include both the refractive index of a material such as a bulk material or medium like air, water, gel or glass as well as the effective refractive index of a waveguide or waveguide structure. Likewise, the terms refractive index, index of refraction, and effective refractive index are used interchangeably herein.)

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is to be understood within the context used in general to convey that an item, term, etc. may be either X, Y, or Z. Thus, such conjunctive language is not generally intended to imply that certain embodiments require the presence of at least one of X, at least one of Y, and at least one of Z.

Language of degree, as used herein, such as the terms "approximately," "about," "generally," and "substantially," represent a value, amount, or characteristic close to the stated value, amount, or characteristic that still performs a desired function or achieves a desired result. For example, the terms "approximately," "about," "generally," and "substantially" may refer to an amount that is within ±10% of, within ±5% of, within ±2% of, within ±1% of, or within ±0.1% of the stated amount. As another example, the terms "generally parallel" and "substantially parallel" refer to a value, amount, or characteristic that departs from exactly parallel by ±10 degrees, by ±5 degrees, by ±2 degrees, by ±1 degree, or by ±0.1 degree, and the terms "generally perpendicular" and "substantially perpendicular" refer to a value, amount, or characteristic that departs from exactly perpendicular by ±10 degrees, by ±5 degrees, by ±2 degrees, by ±1 degree, or by ±0.1 degree.

Various configurations have been described above. Although this invention has been described with reference to these specific configurations, the descriptions are intended to be illustrative of the invention and are not intended to be limiting. Various modifications and applications may occur to those skilled in the art without departing from the true spirit and scope of the invention. Thus, for example, in any method or process disclosed herein, the acts or operations making up the method/process may be performed in any suitable sequence and are not necessarily limited to any particular disclosed sequence. Features or elements from various embodiments and examples discussed above may be combined with one another to produce alternative configurations compatible with embodiments disclosed herein. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. An optical system comprising:
   an optoelectronic device having a coated facet comprising a multilayer coating over a facet, the coated facet configured to be in optical communication with at least a first optical medium during a first time period and a second optical medium during a second time period after the first time period, the first optical medium having a first refractive index and the second optical medium having a second refractive index different from the first refractive index; and
   the multilayer coating configured to provide a first reflectance during the first time period for optical signals in a predetermined wavelength range and to provide a second reflectance during the second time period for optical signals in the predetermined wavelength range, the second reflectance within ±3% of the first reflectance for at least one wavelength in the predetermined wavelength range.

2. The optical system of claim 1, wherein the first reflectance as a function of wavelength and the second reflectance as a function of wavelength intersect one another at least once in the predetermined wavelength range.

3. The optical system of claim 2, wherein the first reflectance as a function of wavelength increases monotonically with wavelength in the predetermined wavelength range and the second reflectance as a function of wavelength decreases monotonically with wavelength in the predetermined wavelength range.

4. The optical system of claim 2, wherein both the first reflectance as a function of wavelength and the second reflectance as a function of wavelength decrease monotonically with wavelength in the predetermined wavelength range.

5. The optical system of claim 2, wherein both the first reflectance as a function of wavelength and the second reflectance as a function of wavelength increase monotonically with wavelength in the predetermined wavelength range.

6. The optical system of claim 1, wherein the first reflectance as a function of wavelength is equal to the second reflectance as a function of wavelength within ±1% across the predetermined wavelength range.

7. The optical system of claim 1, wherein the first reflectance as a function of wavelength and the second reflectance as a function of wavelength are both less than 5% across the predetermined wavelength range.

8. The optical system of claim 1, wherein the refractive index of the optoelectronic device is between 2.5 and 4, the refractive index of the first optical medium is that of air or vacuum, and the refractive index of the second optical medium is from 1.3 to 2.2.

9. The optical system of claim 1, wherein the facet is configured to be in optical communication with a third optical medium during a third time period, the third optical medium having a third refractive index different from the first refractive index and the second refractive index, the coating configured to provide a third reflectance during the third time period for optical signals with the predetermined wavelength range, the third reflectance within ±5% to the first reflectance for at least one wavelength in the predetermined wavelength range and within ±5% to the second reflectance for at least one wavelength in the predetermined wavelength range.

10. The optical system of claim 1, an averaged difference between the second reflectance and the first reflectance across the predetermined wavelength range is ±1% or less.

11. The optical system of claim 1, a difference between the second reflectance and the first reflectance across the predetermined wavelength range is ±1% or less.

12. A method of fabricating an optical system, the method comprising:
    applying a first plurality of layers to a facet of an optoelectronic device, the facet configured to be in optical communication with a first optical medium during a first time period and with a second optical medium during a second time period after the first time period, the first plurality of layers forming a first coating configured to provide a first reflectance during the first time period for optical signals having at least one wavelength in a predetermined wavelength range; and
    after the first time period and before the second time period, applying a second plurality of layers to the first plurality of layers, the first and second pluralities of layers forming a second coating configured to provide a second reflectance during the second time period for at least one wavelength in the predetermined wavelength range;
    wherein the first optical medium has a first refractive index and the second optical medium has a second refractive index different from the first refractive index; and
    wherein the second reflectance is within ±3% of the first reflectance for at least one wavelength in the predetermined wavelength range.

13. The method of claim 12, further comprising placing the optoelectronic device in optical communication with the first optical medium and testing operation of the optoelectronic device during the first time period, and wherein with said device successfully passing said testing, said applying the second plurality of layers is performed.

14. The method of claim 12, further comprising, after applying the second plurality of layers, placing the optoelectronic device in optical communication with the second optical medium.

15. The method of claim 12, wherein the refractive index of the optoelectronic device is from 2.5 to 4, the refractive index of first optical medium is that of air or vacuum and refractive index of the second optical medium is from 1.3 to 2.2.

16. An optical system comprising:
    an optoelectronic device having a facet configured to be in optical communication with at least a first optical medium during a first time period and a second optical medium during a second time period, the first optical medium having a first refractive index and the second optical medium having a second refractive index different from the first refractive index;
    a first coating over said facet, said first coating configured to provide a first reflectance during the first time period for optical signals in a predetermined wavelength range; and a second coating over said first coating, said first and second coatings together configured to provide a second reflectance during the second time period for optical signals in a predetermined wavelength range;

wherein the second reflectance is within ±3% of the first reflectance for at least one wavelength in the predetermined wavelength range.

17. The optical system of claim 16, wherein the first reflectance as a function of wavelength is equal to the second reflectance as a function of wavelength within ±1% across the predetermined wavelength range.

18. The optical system of claim 16, wherein the first reflectance as a function of wavelength and the second reflectance as a function of wavelength are both less than 5% across the predetermined wavelength range.

19. The optical system of claim 16, wherein the refractive index of the optoelectronic device is between 2.5 and 4, the refractive index of the first optical medium is that of air or vacuum, and the refractive index of the second optical medium is from 1.3 to 2.2.

20. The optical system of claim 16, an averaged difference between the second reflectance and the first reflectance across the predetermined wavelength range is ±1% or less.

* * * * *